US006894591B2

(12) United States Patent
Rawnick et al.

(10) Patent No.: US 6,894,591 B2
(45) Date of Patent: May 17, 2005

(54) FLUIDICALLY ADJUSTABLE TRANSMISSION LINE STUB

(75) Inventors: James J. Rawnick, Palm Bay, FL (US); Stephen B. Brown, Palm Bay, FL (US)

(73) Assignee: Harris Corporation, Melbourne, FL (US)

(*) Notice: Subject to any disclaimer, the term of this patent is extended or adjusted under 35 U.S.C. 154(b) by 6 days.

(21) Appl. No.: 10/635,582

(22) Filed: Aug. 6, 2003

(65) Prior Publication Data

US 2005/0030119 A1 Feb. 10, 2005

(51) Int. Cl.[7] .................................................. H03H 7/38

(52) U.S. Cl. ......................................... 333/263; 333/33

(58) Field of Search .......................... 333/263, 33, 246, 333/35

(56) References Cited

U.S. PATENT DOCUMENTS

| | | | | |
|---|---|---|---|---|
| 4,906,956 A | * | 3/1990 | Kakihana | 333/246 |
| 5,162,972 A | | 11/1992 | Gripshover et al. | 361/277 |
| 5,877,123 A | * | 3/1999 | Das | 505/210 |
| 6,515,235 B2 | | 2/2003 | Moller | 174/256 |

OTHER PUBLICATIONS

U.S. Appl. No. 10/369,436, Rawnick, et al., filed Feb. 18, 2003.

U.S. Appl. No. 10/387,208, Rawnick, et al., filed Mar. 11, 2003.

U.S. Appl. No. 10/330,755, Rawnick, et al., filed Dec. 27, 2002.

U.S. Appl. No. 10/330,754, Rawnick, et al., filed Dec. 27, 2002.

U.S. Appl. No. 10/300,456, Rawnick, et al., filed Nov. 19, 2002.

U.S. Appl. No. 10/361,548, Rawnick, et al., filed Feb. 10, 2003.

U.S. Appl. No. 10/387,209, Rawnick, et al., filed Mar. 11, 2003.

U.S. Appl. No. 10/439,094, Rawnick, et al., filed May 15, 2003.

U.S. Appl. No. 10/387,194, Brown, et al., filed Mar. 11, 2003.

U.S. Appl. No. 10/438,435, Brown, et al., filed May 15, 2003.

U.S. Appl. No. 10/414,696, Brown, et al., filed Apr. 16, 2003.

U.S. Appl. No. 10/637,027, Brown, et al., filed Aug. 7, 2003.

U.S. Appl. No. 10/414,650, Brown, et al., filed Apr. 16, 2003.

U.S. Appl. No. 10/635,629, Brown, et al., filed Aug. 6, 2003.

U.S. Appl. No. 10/459,067, Brown, et al., filed Jun. 11, 2003.

U.S. Appl. No. 10/438,436, Rawnick, et al., filed May 15, 2003.

U.S. Appl. No. 10/626,090, Brown, et al., filed Jul. 24, 2003.

U.S. Appl. No. 10/632,632, Rawnick, et al., filed Aug. 1, 2003.

(Continued)

*Primary Examiner*—Stephen E. Jones
(74) *Attorney, Agent, or Firm*—Sacco & Associates, PA

(57) ABSTRACT

The present invention relates to a variable tuned transmission line stub (102). The transmission line stub (102) has an input (104) at one end, an electrical length, and a termination at an opposing end (122). A fluid dielectric (108) is electrically and magnetically coupled to the transmission line stub (102) in a first position to produce a first tuned response. The fluid dielectric (108) is electrically and magnetically decoupled from the transmission line stub (102) in a second position to produce a second tuned response which is distinct from the first tuned response.

16 Claims, 3 Drawing Sheets

OTHER PUBLICATIONS

U.S. Appl. No. 10/614,149, Brown, et al., filed Jul. 7, 2003.

U.S. Appl. No. 10/634,219, Rawnick, et al., filed Aug. 5, 2003.

U.S. Appl. No. 10/458,859, Rawnick, et al., filed Jun. 11, 2003.

U.S. Appl. No. 10/624,378, Brown, et al., filed Jul. 22, 2003.

U.S. Appl. No. 10/438,433, Rawnick, et al., filed May 15, 2003.

U.S. Appl. No. 10/460/947, Rawnick, et al., filed Jun. 13, 2003.

U.S. Appl. No. 10/421,352, Rawnick, et al., filed Apr. 23, 2003.

U.S. Appl. No. 10/409,261, Pike, filed Apr. 8, 2003.

U.S. Appl. No. 10/441,743, Pike, filed May 19, 2003.

U.S. Appl. No. 10/628,846, Pike, et al., filed Jul. 28, 2003.

U.S. Appl. No. 10/448,973, Delgado, et al. filed May 30, 2003.

U.S. Appl. No. 10/300,455, Brown, et al., filed Nov. 19, 2002.

* cited by examiner

FLUIDICALLY ADJUSTABLE TRANSMISSION LINE STUB

BACKGROUND OF THE INVENTION

1. Statement of the Technical Field

The inventive arrangements relate generally to transmission line stubs, and more particularly for transmission line stubs that can be dynamically tuned.

2. Description of the Related Art

Transmission line stubs are commonly used in radio frequency (RF) circuits. A transmission line stub is sometimes said to be resonant at a particular frequency, meaning the line has impedance characteristics similar to a resonant circuit at that frequency. Accordingly, transmission line stubs are often referred to as resonant lines or tuned lines. It should be noted, however, that transmission line stub impedance characteristics are actually a function of voltage reflections, not circuit resonance. On printed circuit boards or substrates, transmission line stubs are typically implemented by creating a line with at least one port at the input, and either an open-circuit or short-circuit to ground at the termination. The input impedance to an open or shorted transmission line stub is typically resistive when the length of the transmission line stub is an even or odd multiple of a quarter-wavelength of the operational frequency. That is, the input to the transmission line stub is at a position of voltage maxima or minima. When the input to the transmission line stub is at a position between the voltage maxima and minima points, the input impedance can have reactive components. Consequently, properly chosen transmission line stubs may be used as parallel-resonant, series-resonant, inductive, or capacitive circuits.

In some instances, a transmission line stub can be capacitively coupled to ground at the termination. When a transmission line stub is terminated in capacitance, the capacitor does not permanently absorb energy, but returns all of the energy to the circuit. Current and voltage are in phase when they arrive at the end of the line. But in flowing through the series combination of the capacitor and the characteristic impedance (ZO) of the transmission line stub, the phase relationship of current and voltage is changed, resulting in a standing wave. The standing wave voltage is minimum at a distance of exactly ⅛ wavelength from the end if the termination when the termination capacitance has the same impedance magnitude is equal to ZO. If the magnitude of the capacitive impedance is greater than ZO (smaller capacitance value), the termination looks more like an open circuit and the voltage minimum moves away from the end. If the magnitude of the capacitive impedance is smaller than ZO, the voltage minimum moves closer to the end. As the voltage minimums and maximums move along the transmission line stubs, so do the regions on the transmission line stub where the transmission line stub acts as an inductance or a capacitance.

Transmission line stubs in RF circuits are typically formed in one of three ways. One configuration known as microstrip, places the signal line on the top of a board surface. A second conductive layer, commonly referred to as a ground plane, is spaced apart from and below the signal line. A second type of configuration known as—buried microstrip is similar except that the signal line is covered with a dielectric substrate material. In a third configuration known as stripline, the signal line is sandwiched between two electrically conductive (ground) planes. Other configurations, including waveguide stubs, are also known in the art.

Low permittivity printed circuit board materials are ordinarily selected for implementing RF circuit designs, including transmission line stubs. For example, polytetrafluoroethylene (PTFE) based composites such as RT/duroid® 6002 (permittivity of 2.94; loss tangent of 0.009) and RT/duroid® 5880 (permittivity of 2.2; loss tangent of 0.0007), both available from Rogers Microwave Products, Advanced Circuit Materials Division, 100 S. Roosevelt Ave, Chandler, Ariz. 85226, are common board material choices.

Two important characteristics of dielectric materials are permittivity (sometimes called the relative permittivity or $\epsilon_r$) and permeability (sometimes referred to as relative permeability or $\mu_r$). The relative permittivity and permeability determine the propagation velocity of a signal, which is approximately inversely proportional to $\sqrt{\mu\epsilon}$. The propagation velocity directly affects the electrical length of a transmission line and therefore the physical length of a transmission line stub.

Further, ignoring loss, the characteristic impedance of a transmission line, such as stripline or microstrip, is equal to $\sqrt{L_1/C_1}$ where $L_1$ is the inductance per unit length and $C_1$ is the capacitance per unit length. The values of $L_1$ and $C_1$ are generally determined by the permittivity and the permeability of the dielectric material(s) used to separate the transmission line structures as well as the physical geometry and spacing of the line structures. Accordingly, the overall geometry of a transmission line stub will be highly dependent on the permittivity and permeability of the dielectric substrate.

The electrical characteristics of transmission line stubs generally cannot be modified once formed on an RF circuit board. This is not a problem where only a fixed frequency response is needed. The geometry of the transmission line can be readily designed and fabricated to achieve the proper characteristic impedance. When a variable frequency response is needed, however, use of a fixed length transmission line stub can be a problem.

A similar problem is encountered in RF circuit design with regard to optimization of circuit components for operation on different RF frequency bands. Line impedances and lengths that are optimized for a first RF frequency band may provide inferior performance when used for other bands, either due to impedance variations and/or variation in electrical length. Such limitations can limit the effective operational frequency range for a given RF system.

SUMMARY OF THE INVENTION

The present invention relates to a variable tuned transmission line stub. The transmission line stub has an input at one end, an electrical length, and a termination at an opposing end. In one arrangement, the electrical length of the transmission line stub can be equal to some integer multiple of a one-quarter wavelength at a design operating frequency. The termination can be an open circuit, a short circuit, or capacitive. A fluid dielectric is electrically and magnetically coupled to the transmission line stub in a first position to produce a first tuned response. The fluid dielectric is electrically and magnetically decoupled from the transmission line stub in a second position to produce a second tuned response which is distinct from the first tuned response.

A fluid control system, which can be responsive to a control signal, can incorporate a pump to selectively move the fluid dielectric from the first position to the second position, or from the second position to the first position. The first position can be defined by a bounded region located adjacent to the transmission line and the second position can be defined by a fluid reservoir. The bounded region can be bounded by a solid conductive material and/or a solid dielectric material.

The volume of the fluid dielectric that is moved can be selectively controlled. The fluid can be moved to change at least one electrical characteristic of the transmission line stub. The electrical characteristic can be, for example, an electrical length, a propagation velocity, an input impedance, and/or a characteristic impedance. The permittivity and/or permeability of the fluid dielectric also can be selected to determine the first and second tuned response when the fluid dielectric is moved from the first position to the second position.

DETAILED DESCRIPTION OF THE PREFERRED EMBODIMENTS

The present invention relates to the use of a fluid dielectric in an RF circuit. The fluid dielectric can be electrically and magnetically coupled to a microstrip, a buried microstrip, and a stripline transmission line stub (herein after collectively referred to as transmission line stub). Since propagation velocity on a transmission line is inversely proportional to $\sqrt{\mu\epsilon}$, increasing the permeability ($\mu$) and/or permittivity ($\epsilon$) in the fluid dielectric decreases propagation velocity of a signal on a transmission line stub coupled to the fluid dielectric, and thus increases the electrical length of the line. Further, the permittivity and/or permeability can be chosen to result in a desired impedance for the transmission line stub as well. Accordingly, a transmission line stub of a given size can be used over a broad range of frequencies and for different circuit applications without altering the physical dimensions of the transmission line stub.

Figure 1:
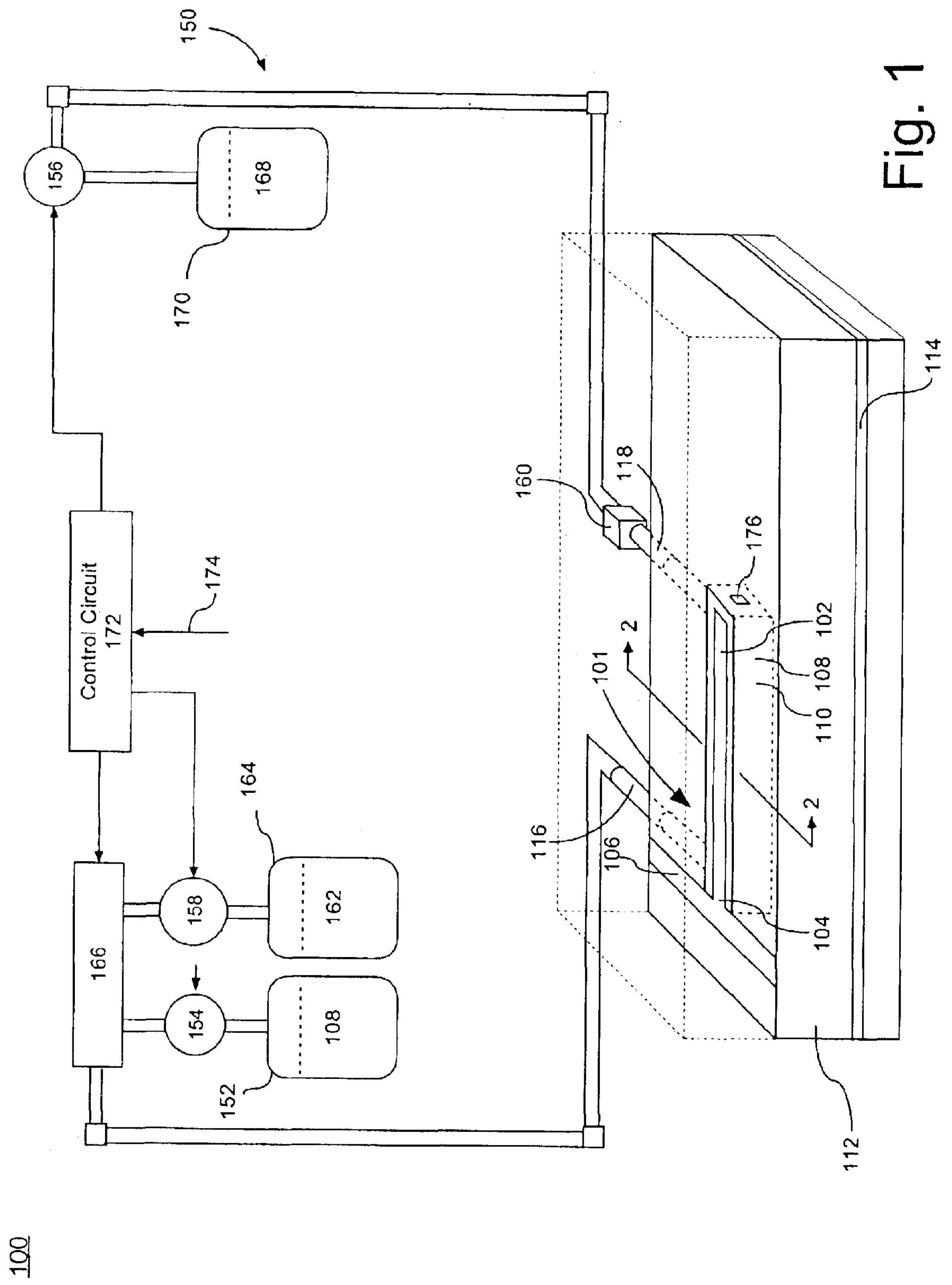
FIG. 1 is a block diagram useful for understanding the variable transmission line stub of the invention.

FIG. 1 is a conceptual diagram that is useful for understanding the variable transmission line stub of the present invention. A transmission line tuning apparatus 100 includes a radio frequency circuit 101 comprising transmission line stub 102 at least partially coupled to a fluid dielectric 108. The transmission line stub 102 can be configured to have an input port 104 connecting to a transmission line 106 or some other portion of the circuit. The fluid dielectric 108 can be constrained within a cavity 110 that is generally positioned relative to the transmission line stub 102 so as to be electrically and magnetically (electrically and magnetically) coupled thereto. The transmission line stub 102 that is shown is generally rectangular in shape, but, it should be noted that the transmission line stub can be any one of a variety of transmission line stub shapes. For example the transmission line stub 102 can be tapered, or have a complex shapes with a variety of different widths, lengths, and/or thicknesses.

The propagation velocity of a signal traveling on the transmission line stub 102 is proportional to $$\frac{c}{\sqrt{\mu_r \varepsilon_r}}.$$

Accordingly, increasing the permeability and/or permittivity in the cavity 110 decreases propagation velocity of the signal on the transmission line stub 102, and thus the electrical length of the line. Hence, the one-quarter wavelength (or any multiple thereof) of the transmission line stub 102 can be reduced by increasing the permeability and/or permittivity in the cavity 110. Accordingly, the frequency at which the transmission line stub is optimized to operate can be varied by adjusting the permeability and/or permittivity in the cavity 110.

The permeability and/or permittivity also can be varied to adjust the relative position of voltage minima and voltage maxima on the transmission line stub 102. In particular, at a given frequency, the position of voltage minima and maxima relative to the input port 104 can be adjusted. For example, the permeability and/or permittivity can be adjusted so that the input port 104 is at a position of voltage maxima or minima, thereby resulting in a resistive input impedance for the transmission line stub 102. In the case where the input port 104 is at a position of voltage maxima for a specific frequency, the transmission line stub 102 exhibits characteristics of a parallel resonant circuit in that the input impedance will decrease as the frequency is shifted up or down. When the input port is at a position of voltage minima, the transmission line stub exhibits characteristics of a series resonant circuit in that the input impedance will increase as the frequency is shifted.

The permeability and/or permittivity also can be adjusted so that the input port 104 is at a position between voltage maxima or minima for a given frequency, thereby resulting in the transmission line stub 102 having a an input impedance which has reactive components. For example, the transmission line stub 102 may have an input impedance that is inductive, capacitive, or complex with both resistive and reactive components.

The permittivity of the cavity 110 also can be adjusted to achieve a particular capacitance for the transmission line stub 102 and the permeability can be adjusted to result in a particular inductance. Further, the permittivity and permeability can be chosen to result in a desired characteristic impedance for the transmission line stub 102. The characteristic impedance can be selected to achieve a desired Q for a particular frequency, to suppress higher resonant modes, and/or to create a mismatch between the impedance of the transmission line stub 102 and the impedance of free space. This impedance mismatch can help to minimize RF radiation from the transmission line stub 102 and reduce electromagnetic interference (EMI).

In the most basic form, the invention can be implemented using a single cavity 110 that can be approximately commensurate with the area beneath that portion of the circuit 101 where the transmission line stub 102 is disposed. For example, the transmission line stub 102 can be disposed on a dielectric substrate 112 and the cavity can be formed within the dielectric substrate 112 so that walls of the cavity form a region bounded by the dielectric substrate 112. However, the cavity structure is not so limited and other embodiments are also possible. For example, a cavity can be formed in a dielectric material, such as a plastic reservoir, which is sandwiched between the transmission line stub 102 and the ground plane 114. In another arrangement, the cavity can be formed in a solid conductive or a solid dielectric material. In yet another arrangement, fluid capillaries can be provided between the transmission line stub 102 and the ground plane 114. Alternatively, in a coaxial line, the fluid can fill the space between the inner and outer conductor.

Regardless of the particular structure selected for the fluid cavity 110, the fluid dielectric 108 can be injected into the fluid cavity 110 to vary the permittivity and/or permeability of the region defined by the cavity 110. For instance, a fluid control system 150 can be provided to inject the fluid dielectric 108 into the cavity 110. In one arrangement the cavity 110 can be completely filled with fluid dielectric 108. In another arrangement, the amount of fluid dielectric 108 injected into the cavity 110 can be adjusted to vary the permittivity and/or permeability within the cavity region.

The fluidic dielectric 108 can be injected into the cavity 110 to vary the capacitance between the transmission line stub 102 and the ground plane 114, the inductance of the transmission line stub 102, or the propagation velocity of a signal on the transmission line stub 102. As noted, the capacitance, inductance and propagation velocity adjustments can be used to tune the transmission line stub 102 for operation at selected frequencies and/or to tune the input impedance characteristics of the transmission line stub 102. Subsequently, by purging the fluid dielectric 108 from the cavity 110, the permittivity and permeability of the region defined by the cavity 110 again can be adjusted. For example, the permittivity and permeability become equal, or substantially equal, to the permittivity and permeability of a vacuum or some other gas or fluid which is used to displace the fluid dielectric 108. In one embodiment, the fluid dielectric 108 can be replaced with a second fluid dielectric having a different permittivity and/or permeability than the first fluid dielectric 108.

Figure 2A:
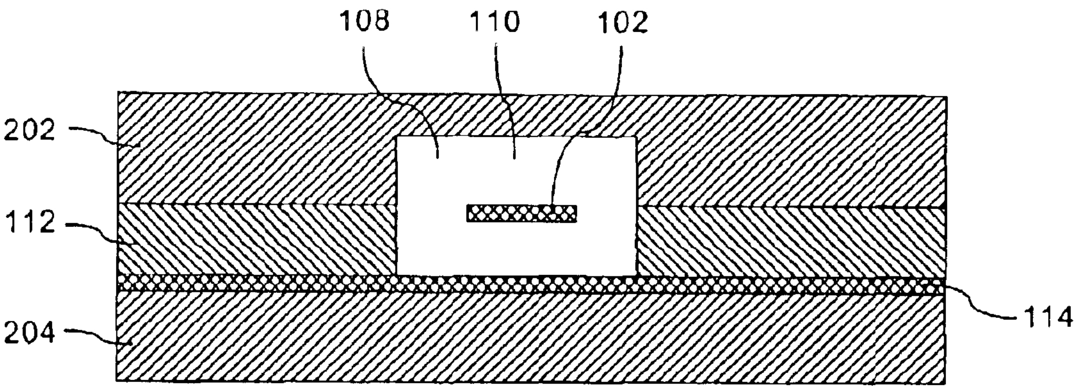
FIG. 2A is a cross-sectional view of the transmission line stub structure in FIG. 1, taken along section line 2—2.

FIG. 2A is a cross-sectional view of one embodiment of the transmission line stub in FIG. 1, taken along line 2—2, that is useful for understanding the invention. As illustrated therein, cavity 110 can be formed in substrate 112 and continued in cap substrate 202 so that the fluidic dielectric is closely coupled to transmission line stub 102 on all sides of the transmission line stub 102. The transmission line stub 102 is suspended within the cavity 110 as shown. The ground plane 114 is disposed below the transmission line stub 102 between substrate 112 and a base substrate 204.

According to one aspect of the invention, the solid dielectric substrate 112, 202, 204 can be formed from a ceramic material. For example, the solid dielectric substrate can be formed from a low temperature co-fired ceramic (LTCC). Processing and fabrication of RF circuits on LTCC is well known to those skilled in the art. LTCC is particularly well suited for the present application because of its compatibility and resistance to attack from a wide range of fluids. The material also has superior properties of wetability and absorption as compared to other types of solid dielectric material. These factors, plus LTCC's proven suitability for manufacturing miniaturized RF circuits, make it a natural choice for use in the present invention. Nonetheless, other dielectric substrates can be used and the invention is not so limited.

Figure 2B:
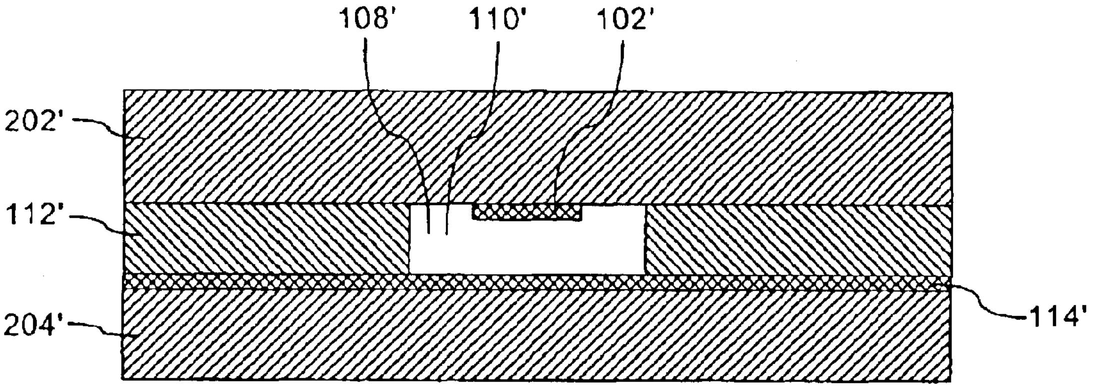
FIG. 2B is a cross-sectional view of an alternative embodiment of a transmission line stub structure of FIG. 1.

FIG. 2B is a cross-sectional view showing an alternative arrangement for the transmission line stub 102' in which the cavity structure 110' extends on only one side of the transmission line stub 102' and the transmission line stub 102' is partially coupled to the solid dielectric substrate 202'. In the case where the transmission line stub is also partially coupled to a solid dielectric, the permeability $\mu_r$ necessary to keep the characteristic impedance of the line constant can be expressed as follows:

$$\mu_r=\mu_{r,sub}(\epsilon_r/\epsilon_{r,sub})$$

where $\mu_{r,sub}$ is the permeability of the solid dielectric substrate 102', $\epsilon_r$ is the permittivity of the fluidic dielectric 108' and $\epsilon_{r,sub}$ is the permittivity of the solid dielectric substrate 102'.

The characteristic impedance of a transmission line is not independent of the transmission line structure. However, it is always proportional to the square root of the ratio of the permeability to the permittivity of the media in which the conducting structures are embedded. Thus, for any transmission line, such as the transmission line stub 102, if both the permeability and permittivity are changed in the same proportion, and no other changes are made, the characteristic impedance will remain constant. The equation specified enforces the condition of a constant ratio of $\mu_r$ to $\epsilon_r$ and thus ensure constant characteristic impedance for all transmission line structures.

At this point it should be noted that while the embodiment of the invention in FIG. 1 and FIGS. 2A and 2B are shown essentially in the form of a buried microstrip construction, the invention herein is not intended to be so limited. Instead, the invention can be implemented using any type of transmission line by replacing at least a portion of a conventional solid dielectric material that is normally coupled to the transmission line with a fluidic dielectric as described herein. For example, and without limitation, the invention can be implemented in transmission line configurations including conventional waveguides, stripline, microstrip, coaxial lines, and embedded coplanar waveguides. All such structures are intended to be within the scope of the invention.

Figure 3:
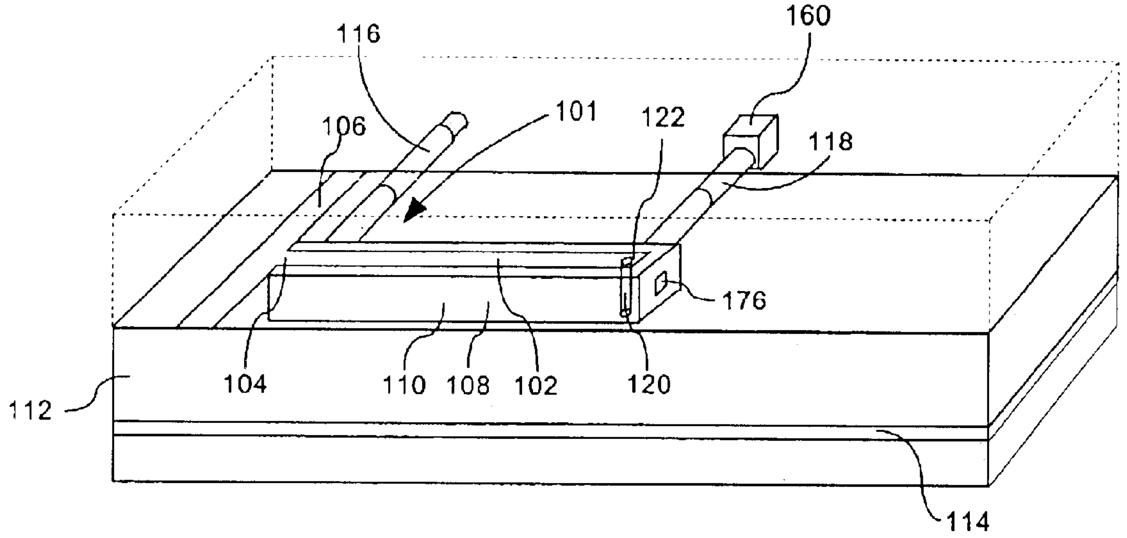
FIG. 3 is a perspective view of an alternate arrangement of the transmission line stub structure of the invention.

As noted, transmission line stubs also can be terminated in a short circuit, as shown in FIG. 3. In this arrangement, a conductor 120 can be provided to terminate the transmission line stub 102 in a short circuit. The conductor 120 can be connected between an end 122 of the transmission line stub 102 and the ground plane 114. In this arrangement, the positions of voltage maxima and voltage minima on the transmission line stub 102 can be reversed in comparison to an un-terminated transmission line stub. Notably, the conductor 120 can be any conductor that can be used to short the transmission line stub 102 to the ground plane 114, for example a conductive post, or a conductive via.

Figure 4:
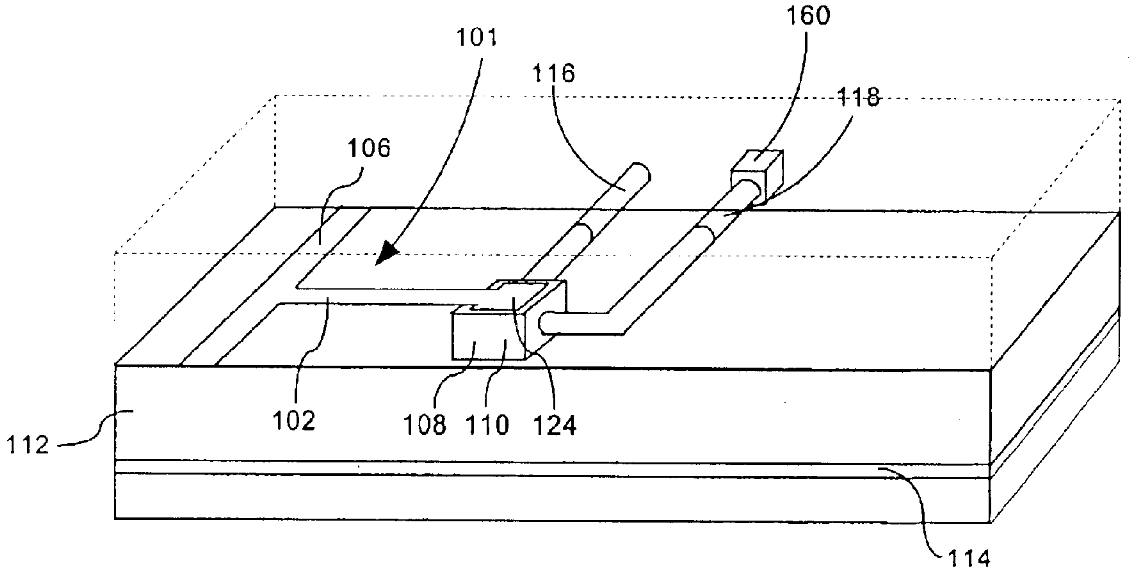
FIG. 4 is a perspective view of an yet another arrangement of the transmission line stub structure of the invention.

The transmission line stub 102 also can be terminated with a reactive impedance, for example using an inductor or a capacitor. In one arrangement, as shown in FIG. 4, the transmission line stub 102 can be provided with an enlarged end portion 124. The enlarged portion 124 as shown is rectangular in shape, but it should be noted that the enlarged portion 124 can be any shape, for instance round, oval, and so on. The end portion 124 can be capacitively coupled to the ground plane 114 to provide a capacitive termination for the transmission line stub 102. Further, the size of the cavity 110 can be approximately commensurate with the area beneath end portion 124. By selectively injecting the fluid dielectric 108 into the cavity 110, the permittivity in the region defined by the cavity 110 can be changed. In one arrangement the cavity 110 can be completely filled with fluid dielictric 108. In another arrangement, the amount of fluid dielectric 108 within the cavity 110 can be adjustable to vary the permittivity within the cavity region. Accordingly, the termination capacitance can be varied which, as noted, varies the position of voltage maxima and minima on the transmission line stub 102. Thus, an additional method for controlling the input impedance of the transmission line stub 102 is provided.

Fluid Control System

Referring once again to FIG. 1, it can be seen that the invention preferably includes a fluid control system 150 for injecting the fluid dielectric 108 into the cavity 110 and/or removing the fluid dielectric 108 from the cavity 110. The fluid control system can comprise any suitable arrangement of reservoirs, pumps, valves and/or conduits that are operable to effectuate the injection and/or removal of the fluid dielectric 108. A wide variety of such fluid control systems may be implemented by those skilled in the art. For example, in one embodiment, the fluid control system can include a reservoir 152 for the fluid dielectric 108, a fluid transfer conduit 116, and a pump 154 for injecting the fluid dielectric into the cavity 110. A second fluid transfer conduit 118 can also be provided for permitting the fluid dielectric 108 to be purged from the fluid cavity 110.

When it is desired to purge the fluid dielectric from the cavity 110, a pump 156 can be used to draw the fluid dielectric from the cavity 110. A control valve 160 can be provided to allow the fluid dielectric to be purged from the cavity 110 as needed. Alternatively, in order to ensure a more complete removal of all fluid dielectric from the cavity 110, one or more pumps 158 can be used to inject a dielectric solvent 162 into the cavity 110. The dielectric solvent 162 can be stored in a second reservoir 164 and can be useful for ensuring that the fluid dielectric is completely and efficiently flushed from the cavity 110. A control valve 166 can be used to selectively control the flow of fluid dielectric 108 and dielectric solvent 108 into the cavity 110. A mixture 168 of the fluid dielectric 108 and any excess dielectric solvent 162 that has been purged from the cavity 110 can be collected in a recovery reservoir 170. For convenience, additional fluid processing, not shown, can also be provided for separating dielectric solvent from the fluid dielectric contained in the recovery reservoir for subsequent reuse. However, the additional fluid processing is a matter of convenience and not essential to the operation of the invention.

A control circuit 172 can be configured for controlling the operation of the fluid control system 150 in response to an analog or digital fluid control signal 174. For example, the control circuit 172 can control the operation of the various valves 160, 166 and pumps 154, 156, 158 necessary to selectively control the presence and removal of the fluid dielectric and the dielectric solvent from the cavity 110. It should be understood that the fluid control system 150 is merely one possible implementation among many that could be used to inject and purge fluid dielectric from the cavity 110 and the invention is not intended to be limited to any particular type of fluid control system. All that is required of the fluid control system is the ability to effectively control the presence and removal of the fluid dielectric 108 from the cavity 110.

A sensor 176 also can be provided which monitors fluid levels in the cavity 110 and provides fluid level data to the control circuit 172. Accordingly, the fluid control system can adjust fluid dielectric 108 levels within the cavity 110 to vary the permittivity and/or permeability in the cavity region. Pre-determined permittivity and/or permeability values correlating to various fluid levels can be predetermined for use by the controller in establishing proper fluid levels.

Composition of Fluid Dielectric

The invention is not limited to any particular fluid dielectric or dielectric solvent. Many applications require variable transmission line stubs to be tunable over a wide frequency range. Accordingly, it may be desirable in many instances to select a fluid dielectric that has a relatively constant response over a broad range of frequencies. Moreover, for broadband applications, the fluids should not have significant resonances over the frequency band of interest. Further, fluid viscosity is a consideration. A fluid dielectric having a lower fluid viscosity may be easier to inject in to the fluid cavity and purge from the fluid cavity. Aside from the foregoing considerations, there are relatively few limits on the type of fluid dielectric that can be used.

Accordingly, those skilled in the art will recognize that the examples of fluid dielectric as shall be disclosed herein are merely by way of example and are not intended to limit in any way the scope of the invention. A nominal value of permittivity ($\epsilon_r$) for certain exemplary fluids is approximately 2.0. However, the present invention can include fluids having extreme values of permittivity. For example, fluids could be selected with permittivity values ranging from approximately 2.0 to about 58. Typical fluid dielectrics can include oil, such as Vacuum Pump Oil MSDS-12602, which have low permittivity and low permeability, and/or solvents, such as such as formamide, which has high permittivity and low permeability. Accordingly, high permittivity can be achieved by incorporating solvents such as formamide into the fluid dielectric. Fluid permittivity also can be increased by adding high permittivity dielectric particle suspensions, for instance powders such as Barium Titanate manufactured by Ferro Corporation of Cleveland, Ohio.

The fluid dielectric also can be provided with a variety of levels of magnetic permeability ($\mu_r$). High permeability can be achieved in a fluid by introducing metal particles/elements to the fluid. For example, magnetic metals such as Fe and Co which have high levels of magnetic permeability can be incorporated into the fluid dielectric. Notably, some solid alloys of these materials can exhibit levels of ($\mu_r$) in excess of one thousand. It should be noted that fluids containing electrically conductive magnetic particles require a mix ratio low enough to ensure that no electrical path can be created in the mixture.

Other fluids comprise suspensions of ferro-magnetic particles, for example those commercially available from FerroTec Corporation of Nashua, N.H. 03060, in a conventional industrial solvent such as water, toluene, mineral oil, silicone, and so on. Magnetic particles such as metallic salts, organo-metallic compounds, and other derivatives also can be used in the fluid. Further, certain ferrofluids also can be used to introduce a high loss tangent into the fluid dielectric. The size of the magnetic particles found in such systems is known to vary to some extent. However, particles sizes in the range of 1 nm to 20 $\mu$m are common. The composition of particles can be selected as necessary to achieve the required permeability in the fluid dielectric. However, magnetic fluid compositions are typically between about 50% to 90% particles by weight. Increasing the number of particles will generally increase the permeability.

Importantly, any variety of permittivity and permeability ratios can be achieved by incorporating fluids having combinations of the above mentioned fluids and particles. For example, an oil having a suspension of ferro-magnetic particles can be used as a low permittivity, high permeability fluid. A solvent having a suspension of dielectric and ferro-magnetic particles can be used as a high permittivity, high permeability fluid. Still, many other fluid or fluid/particle combinations can be used. Additional ingredients such as surfactants can be included to promote uniform dispersion of the particles.

While the preferred embodiments of the invention have been illustrated and described, it will be clear that the invention is not so limited. Numerous modifications, changes, variations, substitutions and equivalents will occur to those skilled in the art without departing from the spirit and scope of the present invention as described in the claims.

We claim:

1. A variable tuned transmission line stub, comprising:

a transmission line stub having an input at one end, an electrical length and a termination at an opposing end;

a fluid dielectric; and;

a fluid control system for selectively moving said fluid dielectric from a first position where said fluid dielectric is electrically and magnetically coupled to said transmission line stub to produce a first tuned circuit response, to a second position where said fluid dielectric is electrically and magnetically decoupled from said transmission line stub to produce a second tuned circuit response distinct from said first tuned circuit response.

2. The variable tuned transmission line stub according to claim 1 wherein said termination is selected from the group consisting of a short circuit and an open circuit.

3. The variable tuned transmission line stub according to claim 1 wherein said termination is capacitive.

4. The variable tuned transmission line stub according to claim 1 wherein at least one electrical characteristic of said transmission line stub is changed when said fluid dielectric is moved from said first position to said second position.

5. The variable tuned transmission line stub according to claim 4 wherein said electrical characteristic is selected from the group consisting of an electrical length, a signal propagation velocity, an input impedance, and a characteristic impedance of said transmission line stub.

6. The variable tuned transmission line stub according to claim 1 wherein said fluid control system includes a pump for moving said fluid dielectric between said first position and said second position.

7. The variable tuned transmission line stub according to claim 6 wherein said first position is defined by abounded region located adjacent to said transmission line and said second position is defined by a fluid storage reservoir.

8. The variable tuned transmission line stub according to claim 7 wherein said bounded region is bounded by at least one of a solid conductive material and a solid dielectric material.

9. The variable tuned transmission line stub according to claim 1 wherein said fluid control system is responsive to a control signal for selectively moving said fluid dielectric between said first and second position.

10. The variable tuned transmission line stub according to claim 9 wherein said fluid control system selectively controls a volume of said fluid dielectric moved to said first position for controlling said first tuned circuit response.

11. The variable tuned transmission line stub according to claim 1 wherein said fluid control system is responsive to a control signal for selectively moving a second fluid dielectric to said first position.

12. A method for dynamically controlling a tuned circuit response of a transmission line stub, comprising the steps of:

producing a first tuned circuit response at an input to a transmission line stub; and responsive to a control signal, producing a second tuned circuit response at said input of said transmission line stub by moving a fluid dielectric from a first position where said fluid dielectric is electrically and magnetically coupled to said transmission line stub, to a second position where said fluid dielectric is electrically and magnetically decoupled from said transmission line stub, said first tuned circuit response different from said second tuned circuit response.

13. The method according to claim 12 further comprising the step of selecting a permittivity and a permeability of said fluid dielectric to selectively determine said first and second tuned circuit response when said fluid dielectric is moved from said first position to said second position.

14. The method according to claim 13 further comprising the step of selecting said first position to be a bounded region located adjacent to said transmission line and selecting said second position to be a fluid storage reservoir spaced apart from said transmission line.

15. The method according to claim 12 further comprising the step of operating a pump to move said fluid dielectric from said first position to said second position.

16. The method according to claim 12 further comprising the step of selecting said transmission line stub to have an electrical length equal to some integer multiple of about one quarter wavelength at a design operating frequency.

* * * * *